United States Patent [19]

Fabula

[11] 4,252,574
[45] Feb. 24, 1981

[54] LOW LEAKAGE N-CHANNEL SOS TRANSISTORS AND METHOD OF MAKING THEM

[75] Inventor: Joseph J. Fabula, Readington, N.J.

[73] Assignee: RCA Corporation, New York, N.Y.

[21] Appl. No.: 93,011

[22] Filed: Nov. 9, 1979

[51] Int. Cl.³ .................. H01L 21/265; H01L 11/00
[52] U.S. Cl. .................................. 148/1.5; 148/175;
357/23; 357/42; 357/50; 357/91
[58] Field of Search .................. 148/1.5, 175; 357/23, 357/50, 91, 42

[56] References Cited

U.S. PATENT DOCUMENTS

| | | | |
|---|---|---|---|
| 3,050,965 | 9/1962 | Ipri et al. | 148/175 |
| 3,890,632 | 6/1975 | Ham et al. | 357/23 |
| 3,933,529 | 1/1976 | Goser | 148/1.5 |
| 4,002,501 | 1/1977 | Tamura | 148/1.5 |
| 4,070,211 | 1/1978 | Harari | 148/187 |
| 4,097,314 | 6/1978 | Schlesier et al. | 148/188 |
| 4,104,087 | 8/1978 | Ipri et al. | 148/1.5 |
| 4,178,191 | 12/1979 | Flatley | 148/1.5 |
| 4,179,792 | 12/1979 | Marshall et al. | 29/571 |

OTHER PUBLICATIONS

Ipri et al., IEEE-Trans. Electron Devices, (Sep. 1976), pp. 1110–1112.
McGreivy, D. J. IEEE-Trans. Electron Devices, ED-24, (1977), 730.

*Primary Examiner*—L. Dewayne Rutledge
*Assistant Examiner*—Upendra Roy
*Attorney, Agent, or Firm*—Birgit E. Morris; Donald S. Cohen; Sanford J. Asman

[57] ABSTRACT

A method for making low leakage N-channel silicon-on-sapphire (SOS) transistor is described. The transistor has reduced edge leakage as a result of acceptor ion impurities introduced into the edges of the silicon islands on which the transistor is formed. The acceptor impurities are introduced into the epitaxial silicon layer immediately before etching the layer to produce the islands. The impurities are then diffused under the edge of the masking layer prior to the removal of the portions of the silicon epitaxial layer, and leaving the edges of the islands more heavily doped than the surface of the island.

9 Claims, 5 Drawing Figures

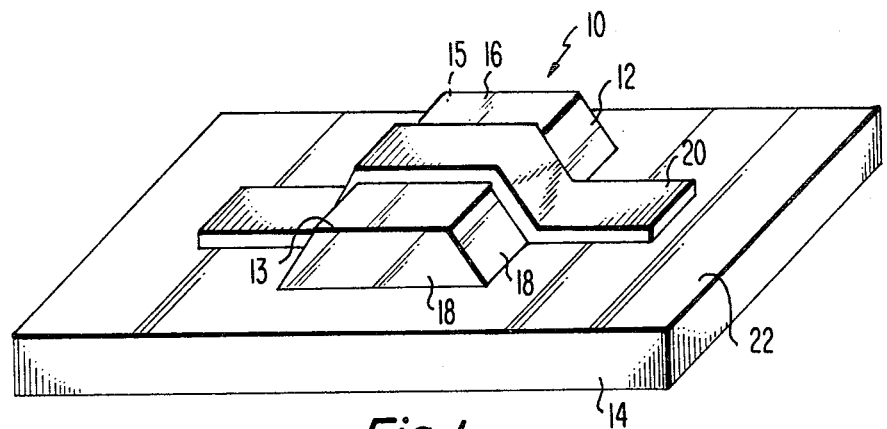
Fig. 1
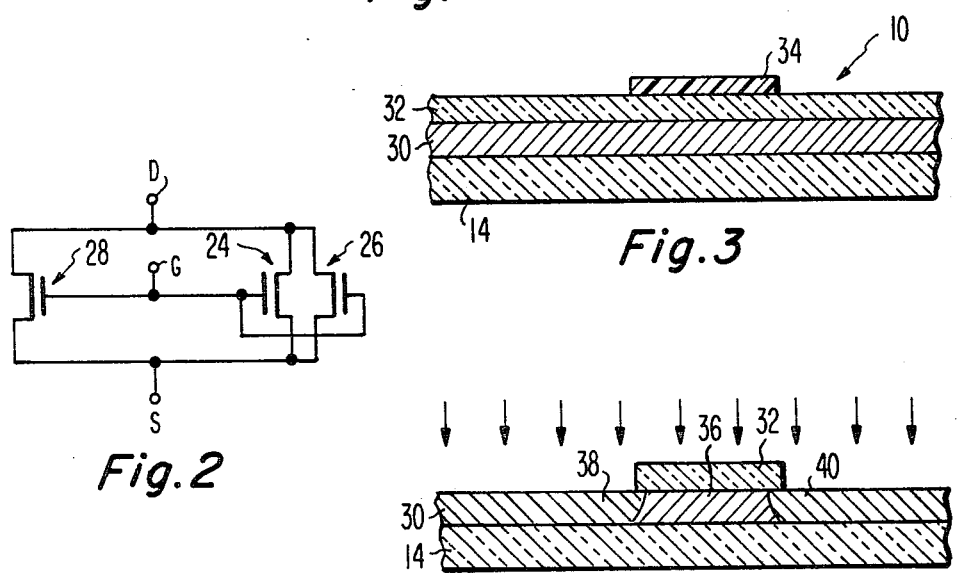
Fig. 2
Fig. 3
Fig. 4
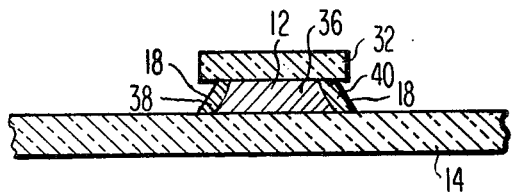
Fig. 5

LOW LEAKAGE N-CHANNEL SOS TRANSISTORS AND METHOD OF MAKING THEM

The Government has rights to the invention described herein pursuant to Contract No. MDA 904-79-G-0032.

BACKGROUND OF THE INVENTION

The present invention relates to integrated circuits, particularly to integrated circuits manufactured using silicon-on-sapphire (SOS) technology.

A problem has heretofore existed in controlling the leakage of the N-channel (NMOS) transistor in complementary symmetry metal oxide semiconductor (CMOS) SOS integrated ciruits or in NMOS/SOS integrated circuits when the threshold voltage of the NMOS transistor is very low. The reason for the problem's existence is that every open geometry, i.e. non $C^2L$, transistor manufactured using SOS technology really consists of three transistors in parallel. The three transistors are a top transistor manufactured on the flat upper surface of the silicon island, i.e. on a silicon surface which is parallel to the (100) crystallographic plane and a pair of "edge transistors" which are manufactured on the edge of the island, i.e. on a silicon surface parallel to the (111) crystallographic plane. Since the edge transistors on the (111) silicon have a threshold voltage approximately 0.7 volts to 1.0 volt lower than the top transistor, there is normally no problem when the integrated circuit is operated from a standard power supply voltage in the range of from 5 to 10 volts. The reason that there is normally no problem is that the top N-channel transistor threshold is generally set to be at least 1.5 volts, so the edge transistors are turned off when the top transistor is turned off. However, there will be a problem if the threshold voltage of the top transistor is reduced to below about 1.0 volt for low voltage operation. There will also be a problem if the N-channel transistors' thresholds shift due to radiation exposure. Then, the associated shift in the threshold voltage of (111) edge transistors is even greater than that of the top transistor, and the shift can cause the edge transistors to go well into the depletion range. The shift in threshold voltage of the edge transistors is a major cause of post-radiation leakage current in SOS arrays.

In order to avoid the problems set forth above, the edge transistor leakage could be controlled by providing a guardband, i.e. a heavily doped region, around the edge of the island in order to raise the threshold voltage of the edge transistors by increasing their surface impurity concentrations. This has generally not been done in the past, because no way of doing it which would not consume extra area and involve an additional photomask step was known heretofore.

SUMMARY OF THE INVENTION

In accordance with the present invention, a method of manufacturing a guardbanded SOS transistor which does not require additional area or an additional photomask step is presented. The standard SOS process is carried out in the normal manner until the photomask defining the "islands" has been used and the associated photoresist layer has been defined and used to remove the silicon dioxide layer from over those portions of the epitaxial silicon which are to be removed to leave the islands. At that point, acceptor ions, such as boron, are either diffused or implanted at a low enough energy to prevent them from passing through the remaining silicon dioxide portions which are used to mask the island etch. Thus, the same silicon dioxide layer that will be used to mask the island etch acts as a barrier to the diffusion or implant, and no additional photomasks are required. At that point, a thermal diffusion step is used to redistribute the implanted ions down into the silicon and laterally under the silicon dioxide mask.

BRIEF DESCRIPTION OF THE DRAWING

In the drawing:

FIG. 1 is a perspective view of the transistor manufactured in accordance with the present invention;

FIG. 2 is an electrical schematic representation of the transistor of FIG. 1; and FIGS. 3-5 are cross sectional views illustrating the method of the present invention.

DETAILED DESCRIPTION OF AN EXEMPLARY EMBODIMENT

Referring now to FIG. 1, a silicon-on-sapphire (SOS) N-channel MOS transistor 10 is shown. The configuration of the transistor 10 is standard in that the transistor 10 comprises an island 12 of epitaxial silicon material formed on the surface 22 of a sapphire substrate 14 in the conventional manner. The transistor 10 comprises a source 13, a drain 15, and a gate 20 which overlies a channel region. Both the source 13 and the drain 15 are of heavily doped N-type material, and the channel region (not shown), which underlies the gate 20, is of lightly doped P type material. The entire surface of the epitaxial silicon island 12 is covered with a thin silicon dioxide layer through which contact openings (not shown) can be made to provide contact to the source 13 and to the drain 15. The oxide layer also acts as the gate dielectric of the transistor 10, as is well-known in the art.

In view of the manner in which the silicon island 12 is formed, namely by etching, the edges 18 of the island 12 have planes which are parallel to the (111) crystallographic plane, whereas the top surface 16 of the island 12 is parallel to the (100) crystallographic plane. As is known in the art, transistors formed on the (111) silicon plane have lower threshold voltages than transistors formed on the (100) silicon plane, assuming that all other things are equal. In order to increase the threshold voltage of the edge transistors, the edges 18 of the silicon island 12, manufactured in accordance with the present invention, are made to have a higher surface concentration of acceptor impurities than the surface 16 of the silicon island 12.

With reference to FIG. 2, the transistor 10 can be modeled as a top transistor 28 in parallel with a pair of edge transistors 24, 26. The edge transistors 24, 26 are formed on the (111) edges 18 of the island 12, whereas the top transistor 28 is formed on the (100) top surface 16 of the island 12. The increased surface concentration of acceptor impurities in the edges 18 relative to the top surface 16 serves to increase the threshold voltage of the edge transistors 24, 26 relative to the top transistor 28.

Referring now to FIGs. 3-5, the method of manufacturing the present invention will be explained. The structure shown in FIG. 3 comprises a partially completed silicon-on-sapphire transistor 10 in the middle of a standard processing sequence, of the type well-known in the art. The structure 10 comprises a sapphire substrate 14 having a silicon layer 30 epitaxially grown thereon. A silicon dioxide layer 32, preferably of thermally grown silicon dioxide having a thickness of about 1000 angstroms is formed on the surface of the epitaxial layer 30 in the standard manner. A photoresist etch mask 34, which has already been applied, defined, and developed in the standard manner is on the surface of the silicon dioxide layer 32. The etch mask 34 is used to protect the silicon dioxide layer 32 in the areas where islands are to be formed. The structure shown in FIG. 3 is placed into a suitable etchant for silicon dioxide, such as buffered hydrofluoric acid (HF), the etch is continued until the silicon dioxide 32 which is not protected by the photoresist mask 34 is removed. Then the photoresist mask 34 is stripped. Through this point, the processing is conventional in the manufacture of SOS integrated circuits.

Referring now to FIG. 4, the novel steps in the present process will be explained. The structure 10 is next subjected to a low energy, i.e. in the range of about 25 KeV to about 100 KeV, ion implantation (represented by the arrows) of a suitable acceptor impurity. In the preferred embodiment of the present invention, boron ions are implanted to a surface concentration of between about $10^{10}$ and $10^{12}$ ions per square centimeter. The ion implantation energy is selected so that the ions do not have sufficient energy to pass through the silicon dioxide mask 32 which was formed in the preceding step.

Following the ion implantation step, a shallow region of highly doped P type silicon will surround the silicon dioxide etch mask 32. The structure 10 is then placed into a diffusion furnace in a nonoxidizing ambient, such as nitrogen gas (N$_2$), for a time and temperature sufficient to diffuse the implanted ions through the epitaxial silicon layer 30 to the sapphire interface. Such a diffusion step can be conducted at 1050° C. for about 15 minutes. Alternatively, in a process for making radiation hard integrated circuits, typically all processing is to be conducted at less than about 1000° C., so the diffusion can take place at 950° C. over several hours. Following the diffusion step there will be highly doped P type regions 38, 40 on either side of, and extending into, the silicon island 36.

The partially formed structure of FIG. 4 is then placed into a suitable etchant for silicon, and the portions of the silicon epitaxial layer 30 which extend out from under the oxide layer 32 are removed by etching, using the silicon dioxide mask 32 as an etch mask. That etch undercuts the silicon dioxide layer 32 forming the (111) surfaces at the edges 18, as shown in FIGS. 1 and 5. However, the ion implanted regions 38, 40 will extend into the edges 18 as shown in FIG. 5, thereby providing the threshold compensation of the present invention.

At this point, normal SOS processing is resumed. Typically, the oxide layer 32 will be stripped. Then, a new oxide layer (the gate oxide) will be grown over the surface of the island 12. The gate 20, typically of doped polycrystalline silicon will be applied, defined, and doped to make it conductive. Then, contact openings will be formed to allow contact to the source 13 and drain 15. A metallization layer will then be applied and defined, and a protective oxide will be formed thereover. Finally, bond pad openings will be formed in the protective oxide layer in the standard manner.

The method of the present invention relies upon the fact that the acceptor ions are introduced into the epitaxial silicon layer prior to the step of etching the silicon from the areas surrounding the locations where transistors will be formed. Thus, the silicon which is to be removed by etching acts as a diffusion source for ions which are used to dope the edges 18 of the island 12. While the preferred embodiment of the invention utilizes an ion implantation, the acceptor ions can be introduced in a diffusion furnace instead.

I claim:
1. An improved method for forming an N-channel SOS transistor comprising the steps of:
   (a) epitaxially growing a silicon layer on a sapphire substrate;
   (b) forming a masking layer on the surface of said silicon layer, said masking layer covering all areas of said silicon layer where islands which will be used for forming transistors are to be located; and
   (c) removing all portions of the epitaxial silicon layer which are not under said masking layer;
   wherein the improvement comprises introducing acceptor impurities into said silicon epitaxial layer and diffusing said impurities into said silicon layer and under the edges of said masking layer before said step of removing the portions of said epitaxial silicon, then using said masking layer to define said islands, whereby said acceptor impurities will be diffused into the edges of said silicon islands when said islands are formed.

2. The method of claim 1 wherein said step of introducing is accomplished by ion implanting.

3. The method of claim 2 wherein said impurities are ion implanted with an energy insufficient to cause them to pass through said masking layer.

4. The method of claim 3 wherein said impurities are ion implanted at an implantation energy between about 25 KeV and 100 KeV.

5. The method of claim 4 wherein said impurities are implanted to a dosage of between about $10^{10}$ and $10^{12}$ acceptor per square centimeter.

6. The method of claim 1 wherein said diffusion step is accomplished in a non-oxidizing ambient.

7. The method of claim 6 wherein said diffusion step is accomplished in a furnace heated to between about 950° C. and 1050° C. for a time sufficient to diffuse said acceptor ions to the sapphire interface.

8. The method of cklaim 1 wherein said step of introducing accpetor impurities is accomplished by diffusion in a diffusion furnace.

9. The method of claim 8 wherein said diffusion steps are conducted in a non-oxidizing ambient.

* * * * *

UNITED STATES PATENT AND TRADEMARK OFFICE
CERTIFICATE OF CORRECTION

PATENT NO. : 4,252,574
DATED : February 24, 1981
INVENTOR(S) : Joseph John Fabula It is certified that error appears in the above-identified patent and that said Letters Patent is hereby corrected as shown below:

Column 4, line 47: After "acceptor" insert --impurities--;

line 54: "cklaim" should be --claim--;

line 55: "accpetor" should be --acceptor--.

Signed and Sealed this

Fifth Day of May 1981

[SEAL]

Attest:

RENE D. TEGTMEYER

*Attesting Officer*   *Acting Commissioner of Patents and Trademarks*